United States Patent [19]

Quoirin

[11] Patent Number: 4,482,911
[45] Date of Patent: Nov. 13, 1984

[54] MONOLITHIC INTEGRATED CIRCUIT EQUIVALENT TO A TRANSISTOR ASSOCIATED WITH THREE ANTISATURATION DIODES

[75] Inventor: Jean B. Quoirin, Paris, France

[73] Assignee: Thomson-CSF, Paris, France

[21] Appl. No.: 158,581

[22] Filed: Jun. 11, 1980

[30] Foreign Application Priority Data

Jun. 12, 1979 [FR] France ................ 79 14996

[51] Int. Cl.³ .................. H01L 27/06; H01L 29/72; H01L 29/167; H03K 17/04
[52] U.S. Cl. ................................. 357/46; 307/300; 307/315; 307/562; 307/565; 357/33; 357/64; 357/86
[58] Field of Search ............ 357/46, 29, 64, 86, 357/33; 307/315, 317, 280, 300, 546, 551, 562, 565

[56] References Cited

U.S. PATENT DOCUMENTS

| | | | |
|---|---|---|---|
| 3,335,341 | 8/1967 | Lin | 357/48 |
| 3,417,260 | 12/1968 | Foster, Jr. | 357/48 |
| 3,423,647 | 1/1969 | Kurosawa et al. | 357/48 |
| 3,525,911 | 8/1970 | Ryerson | 357/48 |
| 3,629,623 | 12/1971 | Sakurai | 357/46 |
| 3,913,213 | 10/1975 | Mills | 357/46 |
| 3,995,307 | 11/1976 | Alkorn et al. | 357/46 |
| 4,031,416 | 6/1977 | Peil | 357/46 |
| 4,072,981 | 2/1978 | Black et al. | 357/46 |
| 4,138,690 | 2/1969 | Nawa et al. | 357/46 |
| 4,293,868 | 10/1981 | Iizuka et al. | 357/46 |

FOREIGN PATENT DOCUMENTS

2377706 9/1978 France .................. 357/46

OTHER PUBLICATIONS

Mikoshiba, IEEE J. of Solid State Circuits, vol. SC 13, No. 4, Aug. 1978, pp. 483–489.
Berger et al., IBM Tech. Discl. Bulletin, vol. 15, No. 4, Oct. 1972, p. 1625.

Primary Examiner—William D. Larkins
Attorney, Agent, or Firm—Cushman, Darby and Cushman

[57] ABSTRACT

A monolithic integrated circuit equivalent to a transistor associated with three antisaturation diodes and a method of fabrication of the circuit comprising an npn structure which is substantially identical with a Darlington circuit. The upper portion of the structure is treated so as to reduce the current gain to values lower than 1 in regions other than the emitter region. A gain lower than unity is thus obtained in the case of the input transistor.

4 Claims, 8 Drawing Figures

FIG_1
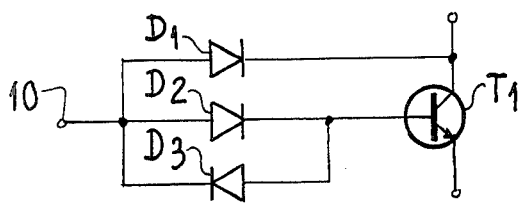
FIG_2
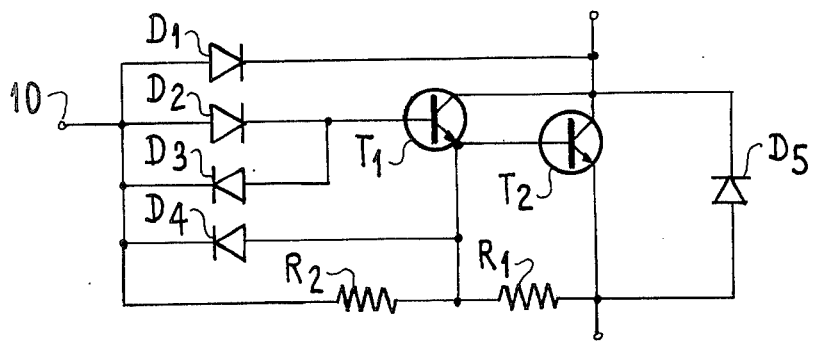
FIG_3
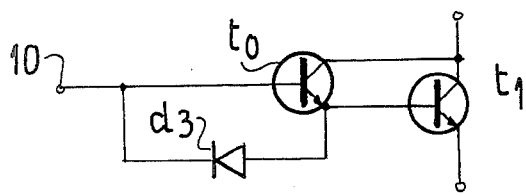
FIG_4
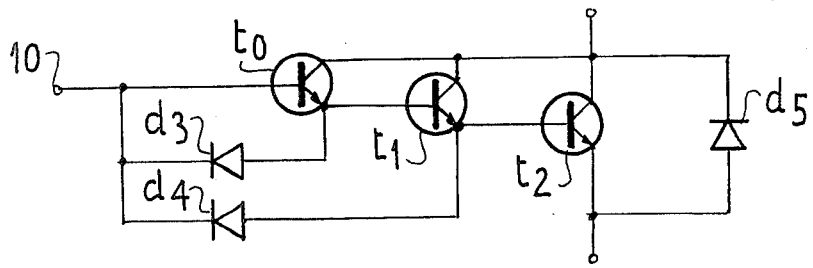

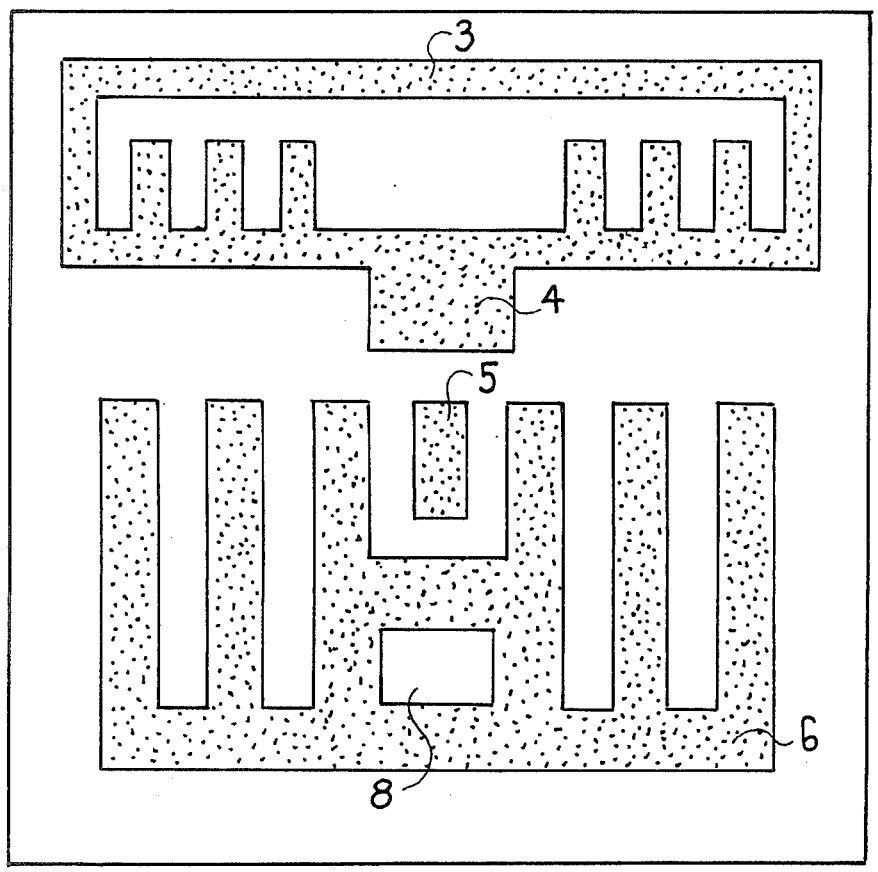
FIG_5-A
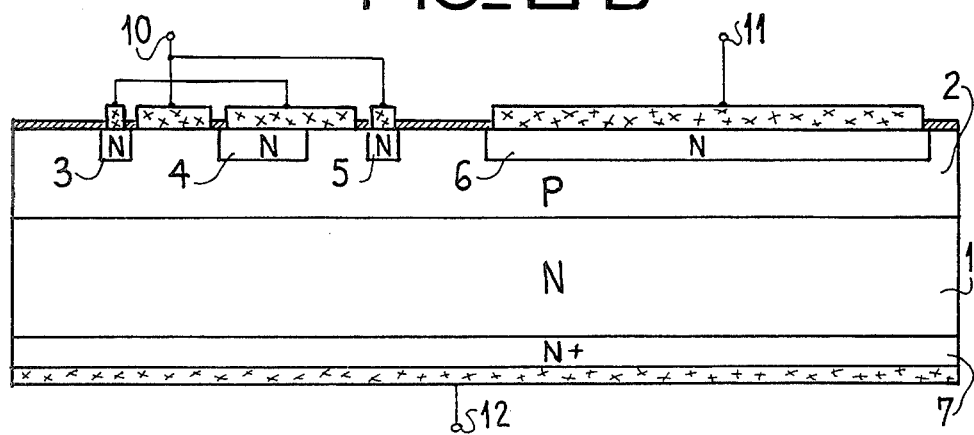
FIG_5-B

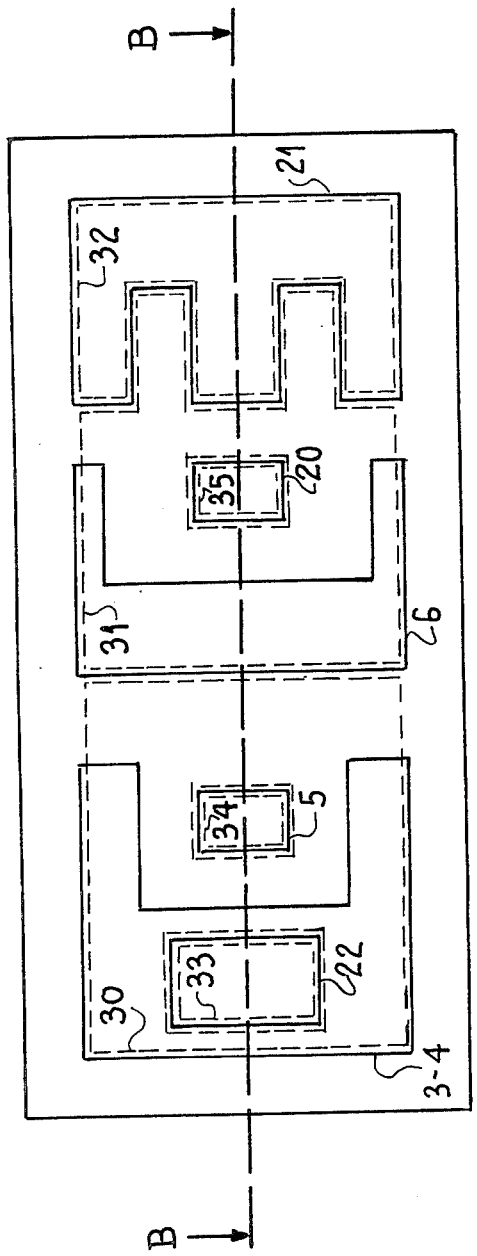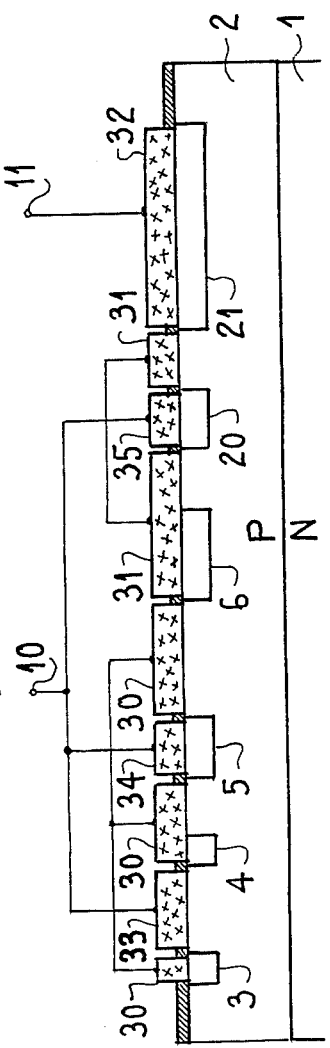

MONOLITHIC INTEGRATED CIRCUIT EQUIVALENT TO A TRANSISTOR ASSOCIATED WITH THREE ANTISATURATION DIODES

This invention relates to an integrated structure comprising a transistor circuit in which the input transistor is provided with antisaturation diodes, as well as to the method of fabrication of a structure of this type.

It is known in the technique that, in order to improve certain characteristics of a transistor, especially in the case of power transistors which operate in the switching mode, it may prove desirable to associate with said transistor three diodes known as antisaturation diodes and connected in the manner shown in FIG. 1. The input of the base of the npn transistor T1 is established by means of two diodes D2 and D3 in antiparallel. This input is connected to the collector of the transistor T1 via a diode D1 which is oriented in the manner shown in the figure.

The arrangement of antisaturation diodes thus contemplated also applies to the case of a Darlington circuit as is also known in the technique and as shown in FIG. 2. Apart from the elements already described with reference to FIG. 1, there can be seen in this figure a transistor T2, the base of which is connected to the emitter of the transistor T1 and the collector of which is connected to the collector of the transistor T1; this common-collector connection serves as a collector output for the circuit and the emitter of the transistor T2 serves as an emitter output for the Darlington circuit. In general, provision is also made for a resistor R1 between the emitters of the transistors T1 and T2, for a resistor R2 between the emitter of the transistor T1 and the input 10 of the circuit and for an output diode D5. Provision is also made between collector and emitter for a diode D4 which is commonly designated as a destorage diode and often included in a Darlington circuit between the emitter and the base of the transistor T1 (that is, the input 10 in the particular case illustrated) in order to reduce the storage time of the circuit.

Circuits which include the transistors T1, T2 and the diodes D4 and D5 in integrated form are known in the technique.

The aim of the present invention is to provide a monolithic integrated circuit which includes the transistor T1 and all of its antisaturation diodes D1, D2, D3, this integration being compatible with the integration of a Darlington circuit as in the case of FIG. 2. In practice, each diode D1, D2, D3 and D4 can in fact be constituted by a plurality of diodes in series.

The invention is based on a detailed and comparative analysis between a transistor provided with its antisaturation diodes such as the transistor T1 of FIG. 1 and a Darlington circuit with destorage diode as shown in FIG. 3. A Darlington circuit is constituted by the association of two transistors t0 and t1, the transistor t1 being a power transistor and the transistor t0 being a control transistor. These transistors have common-collector connections; the base of the transistor t0 serves as an input for the circuit; the emitter of the transistor t0 is connected to the base of the transistor t1; and the emitter of the transistor t1 serves as emitter output for the circuit. Furthermore, in order to achieve a higher switching speed of the assembly, provision is usually made for a so-called destorage diode d3 which is mounted between emitter and base of the control transistor t0 in the manner shown in the figure. In accordance with a practice commonly adopted in Darlington circuits, the value chosen for the gain of the transistor t0 is distinctly higher than unity by reason of the fact that the gain of the assembly transistor is substantially equal to the product of the two gains of the transistors t0 and t1.

The invention is based on the appreciation of the fact that the diagrams of FIGS. 1 and 3 are strictly equivalent in the case in which the gain of the transistor t0 is distinctly lower than unity. Accordingly, said transistor t0 becomes equivalent to the assembly consisting of all of the diodes d1 and d2 shown in FIG. 1. Thus the present invention contemplates a monolithic integrated circuit equivalent to a transistor associated with three antisaturation diodes comprising two transistors in a Darlington connection and a destorage diode, the gain of the first transistor being lower than unity. In order to reduce the gain of said first transistor and to increase the speed of the destorage diode D3, the present invention contemplates the normal fabrication of a Darlington circuit as shown in FIG. 3 with a fabrication step carried out during the process in order to reduce one of the two physical parameters which are responsible for the value of the gain in a transistor structure.

These two parameters are, on the one hand, the lifetime of the minority carriers in the base and, on the other hand, the coefficient of injection of the emitter-base junction.

Reduction of lifetime is effected by diffusion of gold or irradiation (with electrons, with X-rays and γ-rays) in the region occupied by the transistor t0 and the diode d3.

Reduction of the injection coefficient can be performed essentially in two ways: either the base is diffused with a very high concentration of dopant having a value such that the ratio of the quantity of dopant employed for the emitter to the quantity of dopant employed in the base does not exceed a factor 10; alternatively, the n-type (or p-type) emitter region is replaced by a casing of polycrystalline silicon doped with an n-type (or p-type) impurity, the polycrystalline nature of the emitter being such as to inhibit the carrier injection process to an appreciable extent.

After the treatment involving reduction of lifetime or of the injection coefficient, the circuit of FIG. 3 becomes equivalent to a transistor T1 equipped with three antisaturation diodes. Should it be desired to obtain a Darlington circuit arrangement in which the first transistor is equipped with antisaturation diodes, it will be found necessary to add behind the transistor t1 a transistor t2 which is mounted in a Darlington circuit arrangement with respect to said transistor t1 whilst a diode d4 serves as an antisaturation diode in this circuit arrangement. This accordingly results in the diagram shown in FIG. 4 in which the elements equivalent to those of FIG. 3 are designated by the same alphanumeric references.

One advantage of the present invention lies in the fact that well-known techniques are adopted for integrating Darlington circuits and that these structures are modified so as to reduce the gain within a predetermined region in order to obtain a transistor equipped with antisaturation diodes. The description of particular embodiments of the present invention which is carried into effect in the manner described hereinafter will serve to show the simplicity of fabrication of transistor structures equipped with antisaturation diodes in accordance with the invention.

These and other features of the invention will be more apparent upon consideration of the following description and accompanying drawings, wherein:

FIGS. 1 and 2 are schematic diagrams of the circuits to be formed by means of the integrated structure in accordance with the present invention;

FIGS. 3 and 4 illustrate circuits which are equivalent respectively to the circuits of FIGS. 1 and 2 in accordance with the present invention;

FIGS. 5A and 5B are respectively a top view and a diagrammatic sectional view of a transistor associated with its three antisaturation diodes in accordance with the present invention;

FIGS. 6A and 6B are respectively a top view and a sectional view of a Darlington circuit in which the input transistor is associated with three antisaturation diodes.

It will be noted that, in accordance with standard practice in the schematic presentation of semiconductor devices, neither the thicknesses nor the relative dimensions of the different layers and surfaces are drawn to scale. For the purpose of practical construction, those versed in the art will refer to the technological specifications usually adopted in the field under consideration.

FIG. 5B is a schematic sectional view of an integrated structure in accordance with the present invention; this structure makes use of the circuit of FIG. 3 which is equivalent to the circuit of FIG. 1. This sectional view shows a conventional Darlington circuit. The terminal 10 is the input terminal, the terminal 11 is the emitter terminal and the terminal 12 is the collector terminal. A n/n+ collector structure is formed on the top face of an n-type substrate either by epitaxial growth of the n-type layer from an n+ substrate or by diffusion of an n+ layer in an n-type material (triple-diffused technology). The p-type base is formed either by p-type epitaxy or by diffusion. N-type diffusions are then performed simultaneously through a mask on the top surface so as to form n-type regions 3, 4, 5 and 6. If the base has been formed by epitaxy, the process can also be continued by forming a third n-type layer by epitaxial growth on the p-type layer. The n-type casings 3, 4, 5 and 6 are formed in said third layer by diffusion (technology known as LEC: Low Emitter Concentration). The n-type regions 3 and 4 correspond to the emitter of the first transistor t0 (see FIG. 3), the n-type region 5 corresponds to the antisaturation diode d3 and the n-type region 6 corresponds to the emitter of the transistor t1. In the figures, the hatched or shaded layers correspond to layers of silica or other masking and passivation elements and the layers marked with crosses correspond to metallizations. Reference will be made to the figure in order to determine schematically the contacts established by the metallization layers, it being understood that this procedure is generally known in the construction of circuits of the Darlington type. The entire top left-hand portion of the structure is then treated in accordance with the invention with a view to reducing the gain of the vertical transistor structures directly above the n-type layers 3, 4 and 5.

A number of different methods can be adopted for producing said reduction in gain of the transistors to a value which is lower than 1. Should it be decided to reduce the lifetime of the carriers, a localized diffusion of gold can be performed prior to formation of the metal deposits. An alternative possibility consists of irradiation with electrons or else with X-rays or γ-rays. In the cases last mentioned, it will be possible to carry out the treatment through the metal deposits. Prior to treatment, it will be necessary in both cases to mask the top portion of the structure corresponding to the emitter region 6 in order to maintain the gain of the transistor t1. If it is decided to reduce the injection coefficient, the base of the transistor t0 must in that case be overdoped. This can be performed either before, during or after diffusion of the common base of the transistors t0 and t1 according to the physical characteristics of said base and the nature of the doping agents employed. If it is desired to reduce the injection coefficient but to avoid local overdoping of the base region, a localized deposition of doped polycrystalline silicon can in that case be effected at the location of the emitter of the transistor t0 and of the destorage diode. All the methods specified in the foregoing (localized diffusion of gold, localized irradiation, overdoping of the base, doped polycrystalline emitter) which result in local formation of transistor structures having a gain lower than 1 are known in the technique and will not be described in detail here.

The top view of FIG. 5A constitutes only one exemplified embodiment of the present invention. Reference can be made to the different known types of Darlington structures which can be treated in accordance with the invention with a view to reducing the gain of the input transistor or control transistor. The region 8 in the emitter 6 of the transistor t1 corresponds to a reserve for the purpose of forming a diode which is similar to the diode d5 of FIG. 4.

FIG. 6B is a sectional view of an integrated structure in accordance with the present invention. This structure is equivalent to a Darlington circuit in which the input transistor is associated with antisaturation diodes. Only the upper portion of the substrate 1 has been shown. In this figure, the same references have been employed to designate regions and layers which are similar to those already shown in FIG. 5B. In particular, the regions 3, 4, 5 and 6 are again shown. There can also be seen an n-type region 20 corresponding to the destorage diode of the transistor t2 (see FIG. 4) and an n-type region 21 corresponding to the emitter of the transistor t2 and connected to the emitter terminal 11.

The diffusions 3 and 4 which appear as two separate and distinct diffusions in FIG. 6B are in fact one and the safe diffusion provided with a continuous junction region as can be seen in FIG. 6A.

The n-type diffused regions shown in FIG. 6A are represented by full-line contours. The reference 3–4 designates the diffusion contour, the sectional views of which correspond to the regions 3 and 4. An internal region 22 is not diffused. The contours of the metal deposits designated by the references 30 to 35 are indicated by dashed lines. The metal deposits 33, 34 and 35 which cover the regions 22, 5 and 20 are in fact joined together and extend over the other subjacent metal deposits by means of an insulating oxide layer. Moreover, although they are not shown in FIG. 6A, the flush junction surfaces are protected by oxide layers in order to prevent shortcircuiting of the junctions. In FIG. 6B, a plurality of metal deposits which appear to be separate and distinct are in fact one and the same deposit and are designated by the same reference numerals.

The present invention is not limited to the embodiments specifically described in the foregoing but includes all alternative forms and general arrangements which come within the scope of the appended claims.

What is claimed is:

1. A monolithic integrated circuit structure that is electrically equivalent to a transistor having an emitter, a base and a collector, an input terminal, a first diode coupling said input terminal to said collector, a second diode coupling said input terminal to said base and a third diode in parallel with said second diode but connected with opposite polarity thereto, comprising:
- a first semiconductor substrate layer of a first conductivity type and having upper and lower surfaces;
- a second semiconductor layer having an upper surface adjacent to said lower surface of said substrate and a lower surface and being of said first conductivity type but having a higher doping level than said substrate;
- a metalization adjacent to said lower surface of said second layer and forming a contact to said collector of said transistor;
- a third continuous semiconductor layer having a lower surface in contact with the upper surface of said substrate layer and an upper surface, said third layer being of a second conductivity type opposite to said first conductivity type, said layer functioning as said transistor base;
- a fourth semiconductor region of said first conductivity type, formed in said upper surface of said third layer and functioning as a first pole of said second diode, the second pole of said second diode being formed by said third semiconductor layer, said first diode being formed by said third layer and said substrate said fourth region surrounding a portion of said third layer;
- a fifth semiconductor region of said first conductivity type and formed in said upper surface of said third layer, said fifth region functioning as one pole of said third diode, the other pole of said diode being formed by said third layer; and
- a sixth semiconductor region of said first conductivity type and formed in said upper surface of said third layer said sixth region functioning as said transistor emitter, a vertical portion of said monolithic circuit structure including said fourth and fifth regions and a corresponding vertical section of said substrate and second layer being formed so as to have a reduced lifetime of minority carriers.

2. A monolithic integrated circuit structure that is electrically equivalent to a transistor having an emitter, a base and a collector, an input terminal, a first diode coupling said input terminal to said collector, a second diode coupling said input terminal to said base and a third diode in parallel with said second diode but connected with opposite polarity thereto, comprising:
- a first semiconductor substrate layer of a first conductivity type and having upper and lower surfaces;
- a second semiconductor layer having an upper surface adjacent to said lower surface of said substrate and a lower surface and being of said first conductivity type but having a higher doping level than said substrate;
- a metalization adjacent to said lower surface of said second layer and forming a contact equivalent to said collector of said transistor;
- a third continuous semiconductor layer having a lower surface in contact with the upper surface of said substrate layer and having an upper surface, said third layer being of a second conductivity type opposite to said first conductivity type, said layer functioning as said transistor base;
- a fourth semiconductor region of said first conductivity type, formed in said upper surface of said third layer and functioning as a first pole of said second diode, the second pole of said second diode being formed by said third semiconductor layer, said first diode being formed by said third layer and said substrate said fourth region surrounding a portion of said third layer;
- a fifth semiconductor region of said first conductivity type and formed in said upper surface of said third layer, said fifth region functioning as one pole of said third diode, the other pole of said diode being formed by said third layer; and
- a sixth semiconductor region of said first conductivity type and formed in said upper surface of said third layer said sixth region functioning as said transistor emitter, a vertical portion of said monolithic circuit structure including said fourth and fifth regions and a corresponding vertical section of said substrate and second layer being formed so as to have a reduced injection coefficient compared to the area around the sixth region.

3. A monolithic integrated circuit structure that is electrically equivalent to a first transitor having a base, collector and emitter, a second transistor having a base coupled to the emitter of said first transistor, a collector coupled to the collector of said first transistor and an emitter, an input terminal, a first diode coupling said input terminal to said second transistor collector, a second diode coupling said input terminal to said first transistor base, a third diode in parallel with said second diode but connected in opposite polarity therewith, a fourth diode coupling said first transistor emitter to said input terminal, a fifth diode coupling said second transistor emitter to said second transistor collector, a first resistor coupling respective emitters of said first and second transistors and a second resistor coupling said input terminal with said first transistor emitter, comprising:
- a first semiconductor substrate layer of a first conductivity type and having upper and lower surfaces;
- a second semiconductor layer having a lower surface in contact with the upper surface of said first layer and having an upper surface, said second layer being of a second conductivity type opposite to said first conductivity type;
- a third semiconductor region formed in the upper surface of said second layer and being of said first conductivity type, said third region forming one pole of said second diode, the other pole thereof being formed by said second semiconductor layer, said first diode being formed by said second semiconductor layer and said substrate;
- a fourth semiconductor region formed in the upper surface of said second semiconductor layer and being of said first conductivity type, said fourth region forming one pole of said third diode, the other pole thereof being formed by said second semiconductor layer;
- a fifth semiconductor region of said first conductivity type formed in the upper surface of said second layer, said fifth region functioning as the collector of said first transistor;
- a sixth semiconductor region formed in the upper surface of said second layer and being of said first conductivity type, said sixth region functioning as a pole of said fifth diode, the other pole of said fifth diode being formed by said second layer; and
- a seventh semiconductor region of said first conductivity type formed in the upper surface of said second layer, said seventh region functioning as the emitter of said second transistor, a vertical portion of said monolithic circuit structure including said third, fourth and fifth regions and a corresponding vertical section of said substrate and second layer being formed so as to have a reduced lifetime of minority carriers.

4. A monolithic integrated circuit structure that is electrically equivalent to a first transitor having a base, collector and emitter, a second transistor having a base coupled to the emitter of said first transistor, a collector coupled to the collector of said first transistor and an emitter, an input terminal, a first diode coupling said input terminal to said second transistor collector, a second diode coupling said input terminal to said first transistor base, a third diode in parallel with said second diode but connected in opposite polarity therewith, a fourth diode coupling said first transistor emitter to said input terminal, a fifth diode coupling said second transistor emitter to said second transistor collector, a first resistor coupling respective emitters of said first and second transistors and a second resistor coupling said input terminal with said first transistor emitter, comprising:

a first semiconductor substrate layer of a first conductivity type and having up and lower surfaces;

a second semiconductor layer having a lower surface in contact with the upper surface of said first layer and having a upper surface, said second layer being of a second conductivity type opposite to said first conductivity type;

a third semiconductor region formed in the upper surface of said second layer and being of said first conductivity type, said third region forming one pole of said second diode, the other pole thereof being formed by said second semiconductor layer, said first diode being formed by said second semiconductor layer and said substrate;

a fourth semiconductor region formed in the upper surface of said second semiconductor layer and being of said first conductivity type, said fourth region forming one pole of said third diode, the other pole thereof being formed by said second semiconductor layer;

a fifth semiconductor region of said first conductivity type formed in the upper surface of said second layer, said fifth region functioning as the collector of said first transistor;

a sixth semiconductor region formed in the upper surface of said second layer and being of said first conductivity type, said sixth region functioning as a pole of said fifth diode, the other pole of said fifth diode being formed by said second layer; and a seventh semiconductor region of said first conductivity type formed in the upper surface of said second layer, said seventh region functioning as the emitter of said second transistor, a vertical portion of said monolithic circuit structure including said third, fourth and fifth regions and a corresponding vertical section of said substrate and second layer being formed so as to have a reduced injunction coefficient.

* * * * *